US 8,934,314 B2

(12) United States Patent
Taufique et al.

(10) Patent No.: US 8,934,314 B2
(45) Date of Patent: Jan. 13, 2015

(54) APPARATUS AND METHOD FOR IMPROVING POWER DELIVERY IN A MEMORY, SUCH AS, A RANDOM ACCESS MEMORY

(75) Inventors: Mohammed H. Taufique, Austin, TX (US); Daniel J. Cummings, Austin, TX (US); Hieu T. Ngo, Austin, TX (US); Shantanu Ganguly, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,858

(22) PCT Filed: Dec. 28, 2011

(86) PCT No.: PCT/US2011/067631
§ 371 (c)(1),
(2), (4) Date: Jun. 27, 2013

(87) PCT Pub. No.: WO2013/100982
PCT Pub. Date: Jul. 4, 2013

(65) Prior Publication Data
US 2014/0010000 A1    Jan. 9, 2014

(51) Int. Cl.
*G11C 7/00* (2006.01)
*G11C 11/4091* (2006.01)
*G11C 7/12* (2006.01)
*G11C 11/417* (2006.01)

(52) U.S. Cl.
CPC .............. *G11C 11/4091* (2013.01); *G11C 7/12* (2013.01); *G11C 11/417* (2013.01)
USPC ............................ 365/203; 365/227; 365/202

(58) Field of Classification Search
CPC ............................. G11C 11/4091; G11C 7/12
USPC ............................ 365/203, 202, 227
See application file for complete search history.

(56) References Cited

U.S. PATENT DOCUMENTS

| | | | |
|---|---|---|---|
| 5,339,274 A * | 8/1994 | Dhong et al. | 365/203 |
| 6,385,105 B2 * | 5/2002 | Nishioka | 365/202 |
| 6,542,401 B2 * | 4/2003 | Yamauchi et al. | 365/154 |
| 6,631,093 B2 * | 10/2003 | Kumar et al. | 365/203 |
| 6,785,179 B1 * | 8/2004 | Bull et al. | 365/203 |
| 7,327,610 B2 * | 2/2008 | Choi et al. | 365/185.25 |
| 7,495,981 B2 * | 2/2009 | Park | 365/203 |
| 7,548,474 B2 * | 6/2009 | Paparisto et al. | 365/203 |
| 7,881,137 B2 * | 2/2011 | Chen et al. | 365/203 |
| 7,936,624 B2 * | 5/2011 | Clinton | 365/203 |

(Continued)

OTHER PUBLICATIONS

International Search Report and Written Opinion for PCT/US2011/067631, mailed May 30, 2012, 6 pages.

(Continued)

*Primary Examiner* — Viet Q Nguyen
(74) *Attorney, Agent, or Firm* — Schwabe Williamson & Wyatt PC

(57) ABSTRACT

Embodiments of an apparatus and method to improve power delivery including a pre-charge circuit that may include a first voltage supply rail configured to provide a first voltage amount to perform a first phase of a pre-charge of a bit line and a second voltage supply rail configured to provide a second voltage amount to perform a second phase of the pre-charge of the bit line are described herein. In embodiments, the pre-charge circuit may be a pre charge circuit for a static random-access memory (SRAM) memory cell.

20 Claims, 4 Drawing Sheets

(56) References Cited

U.S. PATENT DOCUMENTS

| | | | |
|---|---|---|---|
| 8,064,271 B2 * | 11/2011 | Houston | 365/189.06 |
| 8,174,918 B2 * | 5/2012 | Hess | 365/203 |
| 8,223,567 B2 * | 7/2012 | Abu Rahma et al. | 365/203 |
| 2006/0221738 A1 | 10/2006 | Park et al. | |
| 2006/0274571 A1 | 12/2006 | Maeda et al. | |
| 2008/0291743 A1 | 11/2008 | Edahiro et al. | |

OTHER PUBLICATIONS

International Preliminary Report on Patentability for PCT Application No. PCT/US2011/067631, dated Jul. 10, 2014.

* cited by examiner

APPARATUS AND METHOD FOR IMPROVING POWER DELIVERY IN A MEMORY, SUCH AS, A RANDOM ACCESS MEMORY

CROSS REFERENCE TO RELATED APPLICATION

The present application is a national phase entry under 35 U.S.C. §371 of International Application No. PCT/US2011/067631, filed Dec. 28, 2011, entitled "APPARATUS AND METHOD FOR IMPROVING POWER DELIVERY IN A MEMORY, SUCH AS, A RANDOM ACCESS MEMORY," which designates, among the various States, the United States of America, and the entire contents and disclosures of which are hereby incorporated by reference in their entireties.

TECHNICAL FIELD

This disclosure relates generally to electronic circuits. More particularly, but not exclusively, the present disclosure relates to improving power delivery in a memory, such as, a random access memory.

BACKGROUND INFORMATION

Static Random-Access Memory (SRAM) sub-arrays used in System-on-Chip (SOC) products, such as those contained in handheld devices, may be implemented using dual voltage rails to achieve a reduction in area as well as stand-by power usage. In a dual voltage rail SRAM implementation, bit cells, sense-amplifiers, and pre-charge circuitries may usually be placed on a higher voltage supply rail, e.g., 1.0V-1.05V, while interface logic may be placed on a variable voltage supply rail operating at a lower operating voltage, e.g., 0.7V-0.75V.

A disadvantage of dual voltage rail SRAM implementations, however, may be a lack of dynamic power scaling during a pre-charge phase of bit lines of SRAM memory cells. In some cases, dynamic power scaling (for example, to reduce the amount of power usage) for a memory cache, e.g., a Level-2 or L2 cache, may be acceptable due to relatively lower activity and lower rates of parallel accesses. However, dynamic power scaling may not be acceptable for an SOC in a handheld product. For example, during high usage conditions, such as during a video playback mode, multiple devices and/or processes that have extensive usage of parallel SRAM for graphics generation, video encoder/decoder components, and camera units may be active. Thus, in SOCs in tablets and smart phones, 40-50 SRAM sub-arrays might be accessed simultaneously. Such high rates of parallel access can cause a significant increase in the demand for both an average and peak power for an SRAM voltage supply rail due to the full pre-charging of bit lines to the higher voltage supply rail during access operations.

BRIEF DESCRIPTION OF THE DRAWINGS

Non-limiting and non-exhaustive embodiments are described with reference to the following figures, wherein like reference numerals refer to like parts throughout the various views unless otherwise specified.

FIG. 1(a) illustrates an example SRAM memory cell that can be implemented with embodiments of the pre-charge circuit of FIG. 1.

DETAILED DESCRIPTION

Figure 1:
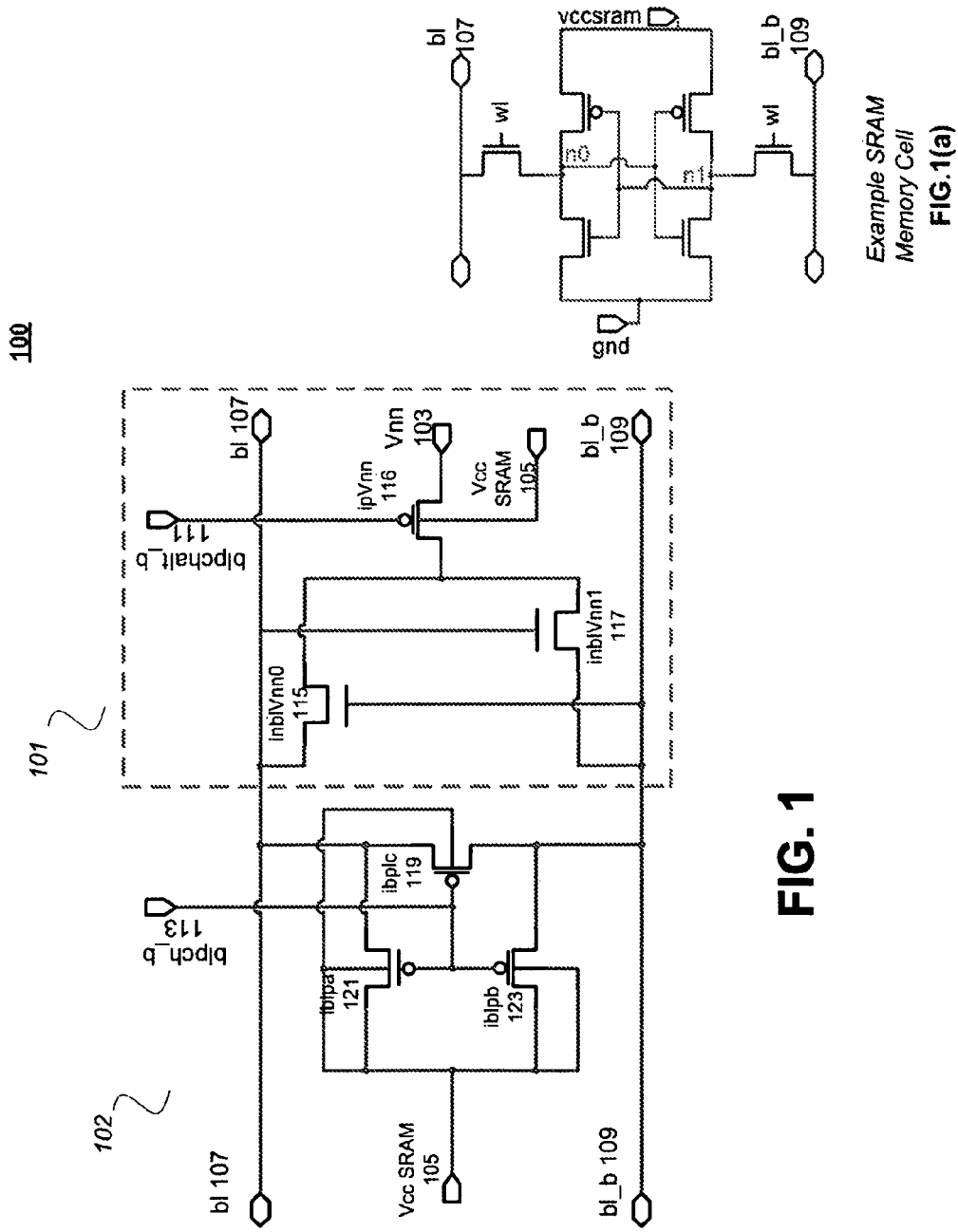
FIG. 1 illustrates a pre-charge circuit in accordance with one embodiment.

Embodiments of a pre-charge circuit including dual voltage supply rails is described herein. In embodiments, the dual voltage rail pre-charge circuit may include a first voltage supply rail configured to provide a first voltage amount to perform a first phase of a pre-charge of a bit line and a second voltage supply rail configured to provide a second voltage amount to perform a second phase of the pre-charge of the bit line are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to various embodiments, the present disclosure describes an apparatus including a first voltage supply rail, a second voltage supply rail and a bit line coupled to the first voltage supply rail and the second voltage supply rail, wherein the first voltage supply rail is configured to provide a first voltage amount to perform a first phase of a pre-charge of a bit line and the second voltage supply rail is configured to provide a second voltage amount to perform a second phase of the pre-charge of the bit line.

In some embodiments, the first voltage supply rail has a lower voltage than the second voltage supply rail. In some embodiments, the bit line is included in a static random access memory (SRAM) cell. In some embodiments, the first voltage supply rail is configured to provide voltage to components of a System-on-Chip (SOC).

In some embodiments, the apparatus may further include a second bit line, wherein the first and the second voltage supply rails are coupled to pre-charge the second bit line. In some embodiments, the apparatus may further include a first transistor and a second transistor cross-coupled between the first bit line and the second bit line. In some embodiments, the first transistor and the second transistor include N-Type Metal Oxide Semiconductor (NMOS) transistors. In some embodiments, the pre-charge occurs after a read or a write operation to a memory cell coupled to the bit line.

According to various embodiments, the present disclosure describes an apparatus including a memory array of static random access memory (SRAM) cells arranged in a plurality of rows and a plurality of columns, a plurality of bit lines associated with the plurality of columns of the SRAM cells, and pre-charge circuitry configured to pre-charge at least one of the plurality of bit-lines after an access operation to the memory array, wherein the pre-charge circuitry includes a first and a second voltage supply rail, wherein the first voltage supply rail is configured to begin a pre-charge of the at least one bit line of the plurality of bit lines by supplying a first voltage amount to the at least one bit line and the second voltage supply rail is configured to finish the pre-charge of the at least one bit line by supplying the at least one bit line with a second voltage amount.

In some embodiments, the memory array is part of a system-on-chip (SOC). In some embodiments, the apparatus may include a first transistor and a second transistor cross-coupled between the at least one bit line and a second bit line. In some embodiments, the first transistor is enabled and the second transistor is disabled during a first phase of the pre-charge of the bit line in which the first voltage amount is supplied.

According to various embodiments, the present disclosure describes a method including receiving by a pre-charge circuit, a first input signal to enable a bit line to charge to a first voltage in a first phase and receiving by the pre-charge circuit, a second input signal to enable the bit line to charge from the first voltage to a second voltage in a second phase.

In some embodiments, in response to the receiving the first input signal, the method further includes enabling a transistor coupled between a first voltage supply rail and the bit line. In some embodiments, in response to the receiving the first input signal, the method further includes enabling a transistor coupled between a system-on-chip (SOC) voltage supply rail and the bit line. In some embodiments, in response to receiving the second input signal, the method further includes enabling a transistor coupled between an SRAM supply rail and the bit line.

According to various embodiments, the present disclosure describes a system including a main memory having computer-executable instructions stored thereon, a processor coupled to the main memory and configured to execute the stored computer-executable instructions to cause generation of at least one input signal, at least one cache memory coupled to the processor; the cache memory including a memory array of static random access memory (SRAM) cells, wherein each of the SRAM cells are coupled to a corresponding pre-charge circuit. In some embodiments, the corresponding pre-charge circuit includes a first and a second voltage supply rail. In some embodiments, in response to the at least one input signal, the first voltage supply rail is configured to begin a pre-charge of a bit line in an SRAM cell by supplying a first voltage amount to the bit line and the second voltage supply rail is configured to continue the pre-charge by supplying a second remaining voltage amount to the bit line.

In some embodiments, the first voltage supply rail has a lower voltage than the second voltage supply rail. In some embodiments, the bit line is coupled to a selected column of the SRAM cells and is configured to be pre-charged after an access operation that includes a read or a write operation. In some embodiments, the second voltage supply rail is configured to finish the pre-charge after a next access to the memory array is requested. Other embodiments may be described and/or claimed.

In an SRAM memory cell, during operation, a pre-charge of a low bit line occurs before a read or a write operation. The pre-charge may typically be performed by an SRAM voltage supply rail having a voltage of approximately 1.0V to 1.05V. However, a feature of one embodiment of the pre-charge circuit described below is an ability to utilize a component voltage supply rail (such as an SOC voltage supply rail) to assist the SRAM voltage supply rail during the pre-charge. This feature can be used, in one embodiment, in SOC implementations to provide significant reduction in peak current and power delivery by the SRAM voltage supply rail. In an embodiment, the SOC voltage supply rail may be well distributed over an SOC chip and more prevalent than the higher SRAM voltage supply rail. As a result, in embodiments, the SOC voltage supply rail is more readily available to assist in the pre-charge of the low bit line from "0" to "1."

In embodiments, an SOC voltage supply rail having a lower voltage than an SRAM voltage supply rail may provide a first voltage amount to perform an initial or a first phase of a pre-charge of a bit line. After the initial phase of the pre-charge, in embodiments, the bit line may remain at a resulting voltage level, e.g., 0.7V-0.75V, until a request for an access, upon which the bit line may be pre-charged from 0.7V-0.75V to a higher voltage supply rail level, e.g., 1.0V-1.05V by the SRAM voltage supply rail. In embodiments, a dual voltage rail pre-charge circuit described below may be performance neutral and reduce undue cost associated with an SRAM voltage regulator (e.g., package cap, larger regulator, etc.) for the SRAM voltage supply rail. Embodiments may also allow an integration of a smaller SRAM bit cell as a voltage droop may be constrained to meet an active $V_{min}$ of the SRAM bit cell.

FIG. 1 illustrates an embodiment of a dual voltage rail pre-charge circuit 100. In embodiments, dual voltage rail pre-charge circuit 100 may include a first phase voltage pre-charge circuit 101 and a second phase voltage pre-charge circuit 102 of an SRAM memory cell such as shown in FIG. 1(a).

In embodiments, dual voltage rail pre-charge circuit 100 may include a first voltage supply rail ("$V_{nn}$") 103 and a second voltage supply rail ("$V_{cc}$ SRAM") 105. In embodiments, $V_{nn}$ 103 may include a lower voltage System-on-Chip (SOC) supply rail (e.g., 0.7V-0.75V) associated with supplying power to SOC components, while $V_{cc}$ SRAM 105 may include a higher voltage SRAM supply rail (e.g., 1.0V-1.05V) associated with supplying power to an SRAM memory cell. As shown in FIG. 1, $V_{nn}$ 103 and $V_{cc}$ SRAM 105 may be coupled to a first bit line 107 and a second bit line 109. In embodiments, $V_{nn}$ 103 may be configured to provide a first voltage amount to perform a first phase of a pre-charge of one of the bit lines 107 or 109, while $V_{cc}$ SRAM 105 may be configured to provide a second voltage amount to perform a second phase of the pre-charge of that bit line.

As shown for the embodiment, the first phase voltage pre-charge circuit 101 may also include transistors 115 and 117, cross-coupled between bit lines 107 and 109. In the embodiment shown, transistors 115 and 117 may be N-Type Metal Oxide Semiconductor (NMOS) transistors. In other embodiments, transistors 115 and 117 may include P-Type Metal Oxide (PMOS) transistors or other suitable types of transistors. In the embodiment, first phase voltage pre-charge circuit 101 may also include a transistor 116, coupled to $V_{nn}$ 103 and bit lines 107 and 109.

Note that second phase voltage pre-charge circuit 102 may include, in embodiments, transistors 119, 121, and 123, which may be coupled to $V_{cc}$ SRAM 105 and bit lines 107 and 109. In embodiments, transistors 119, 121, and 123, may be PMOS transistors or other suitable type of transistor.

To further illustrate the embodiment, FIG. 1(a) illustrates an example SRAM memory cell such as may be coupled to dual voltage rail pre-charge circuit 100. Bit lines 107 and 109 of FIG. 1(a) may be coupled to respective bit lines 107 and 109 of FIG. 1. Note that in embodiments, bit lines of the SRAM memory cell may be pre-charged to a voltage after both read and write operations since it may not be known whether a next access may be a read or write operation. For example, in an embodiment, bit lines 107 and 109 may be pre-charged high before a read operation. Thus, during a read operation where a content of the SRAM memory cell may be a "0," stored at a node $n_0$, when a word line ("wl" in FIG. 1(a)) is raised, bl 107 may be pulled down toward zero. In embodiments, a sense amplifier may then detect which bit line may have a higher voltage to determine whether a 1 or a 0 is stored. Note that FIG. 1(a) is provided as one example. Other suitable memory cell types such as, for example, other SRAM cell types, e.g., 8-transistor (8T), 10-transistor (10T), multiple-port, etc., may also be coupled to embodiments of the pre-charge circuit described herein.

Accordingly, returning to the embodiment of FIG. 1, during a pre-charge operation, an input signal 111 may be associated with a bit line receiving voltage from $V_{nn}$ 103 during a first phase of the pre-charge operation while an input signal 113 may be associated with the bit line receiving voltage from $V_{cc}$ SRAM during a second phase of the pre-charge operation. Accordingly, in the embodiment, input signal 111 may be received prior to input signal 113 in order to activate or enable transistor 116, allowing enough time for a low ("0") bit line of bit line 107 or 109 to charge to approximately 0.7V. Note that in some embodiments, only one of bit line 107 or 109 may be low prior to the pre-charge operation. Since the other bit line may be high when input signal 111 is received, cross-coupled transistors 115 and 117 may be used to prevent the higher bit line at, e.g., 1.05V, of bit line 107 or 109 from discharging onto $V_{nn}$ 103, which may be at a lower voltage of, e.g., 0.7V.

To further illustrate, if bit line 107 is "1" and bit line 109 is "0," transistor 117 may be activated or on during a first pre-charge phase, while transistor 115 is disabled or off. Note that in embodiments although transistor 115 may begin to slightly turn on as bit line 109 rises, bit line 109 may always be at a potential below $V_{nn}$ 103. In embodiments, a timer or control logic may prevent input signals 111 and 113 from going to "0" at a same time, thus preventing a short between $V_{cc}$ SRAM 105 and $V_{nn}$ 103. Note that in other examples, the low bit line to be pre-charged may be bit line 107, in which case transistor 115 may be enabled and transistor 117 disabled.

Figure 2:
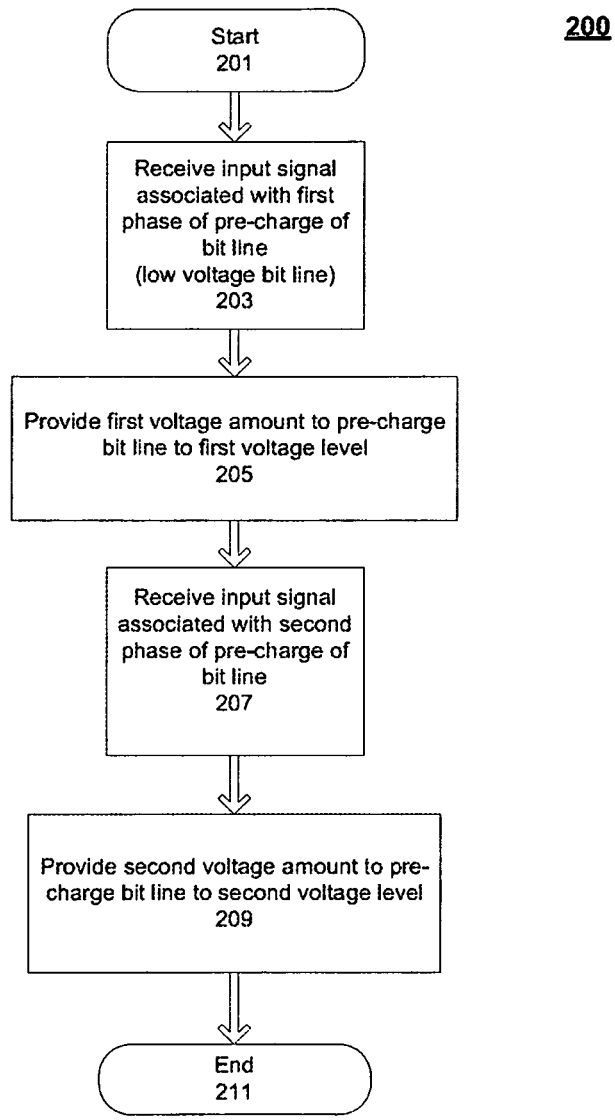
FIG. 2 illustrates a flow diagram in accordance with one embodiment.

Reference is now made to FIG. 2, which is a flow diagram of a method 200 for pre-charging a bit line in two phases in accordance with embodiments. In the embodiment shown, after a start block at 201, dual voltage rail pre-charge circuit 100 of FIG. 1, may receive an input signal such as input signal 111 associated with a first phase of a pre-charge of a low bit line, e.g., bit line 107 or 109. In embodiments, pre-charge circuit 101 may receive the input signal after a completion of a read or write phase. For example, in an embodiment, if bit line 107 is at "1," and the low bit line to be pre-charged is bit line 109, at "0," receiving the input signal 111 may include enabling or activating a transistor 116 coupled to/between a first voltage supply rail, such as an SOC lower voltage supply rail $V_{nn}$ 103, and the low bit line 109.

Thus, at a next block 205, in the embodiment, activating the transistor 116 allows dual voltage rail pre-charge circuit 100 to provide a first voltage amount to perform a first phase of the pre-charge, thus charging the bit line 109 to a first voltage level. In embodiments, the bit line 109 may remain at the first voltage level until a next access may be initiated. In embodiments, once the next access is initiated, at a next block 207, the dual voltage rail pre-charge circuit 100 may receive an input signal 113 associated with a second phase of the pre-charge of the bit line 109.

In embodiments, the input signal 113 may activate a transistor 119, coupled between a higher voltage supply rail, e.g., $V_{cc}$ SRAM supply rail 105, and bit line 109. Accordingly, in embodiments, the dual voltage rail pre-charge circuit 100 may provide a second voltage amount to perform a second phase of the pre-charge of bit line 109 by charging bit line 109 to a full voltage supply rail amount, e.g. 1.0V-1.05V, at a block 209.

Note that in the example, because $V_{nn}$ 103 pulls low bit line 109 to a voltage, e.g. 0.7V, little effort may be required by transistors 119, 121, and 123 of second phase voltage pre-charge circuit 102 of FIG. 1 to pull low bit line 109 a remaining amount, from 0.7V to a full supply rail voltage, e.g., 1.0V-1.05V. Thus, in embodiments, area required for the transistors 119, 121, and 123 may be significantly reduced since weaker (and thus smaller-sized) transistors may be used.

Embodiments of the pre-charge circuit described herein may be used in a number of implementations and applications. For example, handheld devices, including but not limited to smart phones, nettops, tablets and other devices that may be designed with SOC including SRAM memory.

Figure 3:
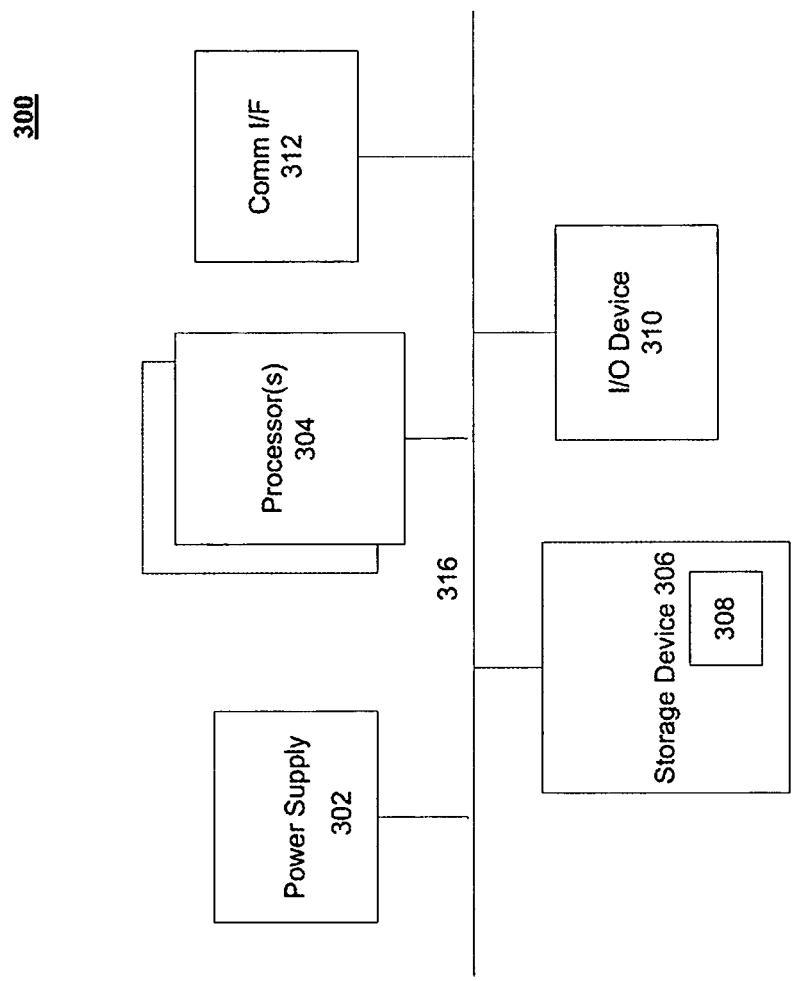
FIG. 3 is a block diagram that illustrates an example computer system suitable to practice the disclosed pre-charge circuit and method of various embodiments.

Referring now to FIG. 3, which is a block diagram that illustrates an example computer system 300 suitable to practice the disclosed pre-charge circuit/method of various embodiments. As shown, the computer system 300 may include a power supply unit 302, a number of processors or processor cores 304, a storage device 306 having computer-executable such as processor-readable and processor-executable instructions 308 stored therein, and a communication interface 312. The computer system 300 may also comprise input/output devices 310 (such as a keyboard, display screen, cursor control, and so forth). For the purpose of this application, including the claims, the terms "processor" and "processor cores" may be considered synonymous, unless the context clearly requires otherwise.

The one or more storage devices 306 may comprise a tangible, non-transitory computer-readable storage device (such as a diskette, hard drive, compact disc read only memory (CDROM), hardware storage unit, and so forth). In embodiments, the one or more storage devices 306 may be a main memory. In embodiments, one or more storage devices 306 may include an SRAM memory. including a memory array of static random access memory (SRAM) cells arranged in a plurality of rows and a plurality of columns. In embodiments, storage devices 306 may include a plurality of bit lines associated with the plurality of columns of the SRAM cells and pre-charge circuitry (such as shown in FIG. 1)_configured to pre-charge at least one of the plurality of bit-lines after an access operation to the memory array. In embodiments, the pre-charge circuitry may include a first voltage supply rail that may be configured to begin a pre-charge of the at least one bit line of the plurality of bit lines by supplying a first voltage amount to the at least one bit line. In embodiments; the pre-charge circuitry may also include a second voltage supply rail configured to finish the pre-charge of the at least one bit line by supplying the at least one bit line with a second voltage amount. In embodiments, the memory array may be part of an SOC.

In embodiments, pre-charge circuitry may be associated with the SRAM alternatively or additionally be located elsewhere in the computer system 300, such as for example, in a cache associated with processor 304. The SRAM may also be located in routers, and/or peripheral equipment such as internal CPU cache, external burst mode CPU cache, hard disk buffers, router buffers, LCD screens and printers and CDROM and CDRW drives.

The various elements of FIG. 3 may be coupled to each other via a system bus or communication pathway 316, which represents one or more pathways. In the case of multiple buses, they may be bridged by one or more bus bridges (not shown).

The storage device 306 may in some embodiments be a main memory. In some embodiments, storage device 306 may be employed to store a working copy and a permanent copy of programming instructions implementing one or more operating systems, firmware modules or drivers, applications, and so forth, herein collectively denoted as 308. The permanent copy of the programming instructions may be placed into permanent storage in the factory, or in the field, through, for example, a distribution medium (not shown), such as a compact disc (CD), or through the communication interface 312 (from a distribution server (not shown)).

According to various embodiments, one or more of the depicted components of the system 300 and/or other element(s) may include a keyboard, LCD screen, non-volatile memory port, multiple antennas, graphics processor, application processor, speakers, or other associated mobile device elements, including a camera. The remaining constitution of the various elements of the computer system 300 is known, and accordingly will not be further described in detail.

Figure 4:
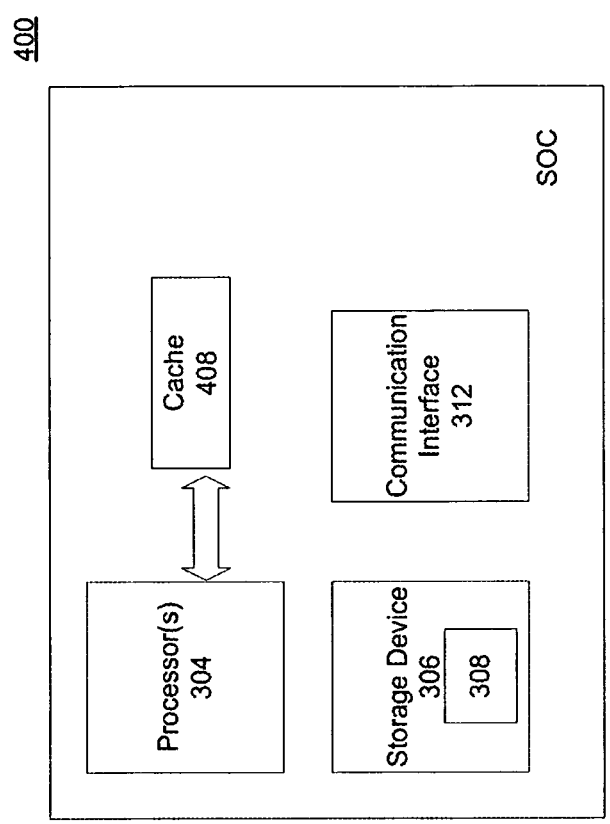
FIG. 4 is a block diagram that illustrates an example System-on-Chip (SOC) suitable to practice the disclosed embodiments.

In some embodiments, at least one of processor(s) 304 may be integrated on a same die with one or more other components of system 300. For example, at least one of the processor(s) 304 may be integrated on the same die with one or more other components of system 300 to form a System on Chip (SOC) 400, as shown in FIG. 4. SOC 400 may include one or more processors 304, at least one cache memory 408 coupled to the one or more processors, storage device 306, and/or communication interface 312. In embodiments, the one or more processors may be configured to execute stored computer-executable instructions stored in storage device 306 to generate or cause to be generated at least one input signal, such as the signals 111 and 113 discussed above.

The at least one cache memory 408 coupled to the processor 304 may include a memory array of static random access memory (SRAM) cells. In embodiments, one or more of the SRAM cells may be coupled to a corresponding pre-charge circuit including a first and a second voltage supply rail. In embodiments, in response to the at least one input signal, the first voltage supply rail may be configured to begin a pre-charge of a bit line in an SRAM cell by supplying a first voltage amount to the bit line and the second voltage supply rail is configured to continue the pre-charge by supplying a second remaining voltage amount to the bit line.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, P-type and N-type transistors, and so forth. In other embodiments, different configurations can be provided in view of whether N-type transistors are used instead of P-type transistors, and so forth.

These and other modifications can be made in light of the above detailed description. The terms used in the following claims should not be construed to be limited to the specific embodiments disclosed in the specification.

What is claimed is:

1. An apparatus, comprising:
a first voltage supply rail;
a second voltage supply rail;
a first bit line and a second bit line, each coupled to the first voltage supply rail and the second voltage supply rail; and
a first transistor and a second transistor cross-coupled between the first bit line and the second bit line,
wherein the first voltage supply rail is configured to provide a first voltage amount to perform a first phase of a pre-charge of the first bit line and the second voltage supply rail is configured to provide a second voltage amount to perform a second phase of the pre-charge of the first bit line, and wherein the first transistor is enabled and the second transistor is disabled during the first phase of the pre-charge of the first bit line in which the first voltage amount is supplied.

2. The apparatus of claim 1, wherein the first voltage supply rail has a lower voltage than the second voltage supply rail.

3. The apparatus of claim 1, wherein the first bit line is included in a static random access memory (SRAM) cell.

4. The apparatus of claim 1, wherein the first voltage supply rail is configured to provide voltage to components of a System-on-Chip (SOC).

5. The apparatus of claim 1, wherein the first and the second voltage supply rails are coupled to pre-charge the second bit line.

6. The apparatus of claim 1, wherein the first transistor and the second transistor include N-Type Metal Oxide Semiconductor (NMOS) transistors.

7. The apparatus of claim 1, wherein the pre-charge occurs after a read or a write operation to a memory cell coupled to the first bit line.

8. An apparatus, comprising:
a memory array of static random access memory (SRAM) cells arranged in a plurality of rows and a plurality of columns;
a plurality of bit lines associated with the plurality of columns of the SRAM cells; and
pre-charge circuitry configured to pre-charge at least one of the plurality of bit-lines after an access operation to the memory array, wherein the pre-charge circuitry includes:
a first and a second voltage supply rail, wherein the first voltage supply rail is configured to perform a first phase of a pre-charge of the at least one bit line of the plurality of bit lines by supplying a first voltage amount to the at least one bit line, and wherein the second voltage supply rail is configured to perform a second phase of the pre-charge of the at least one bit line by supplying the at least one bit line with a second voltage amount;
a first transistor and a second transistor cross-coupled between the at least one bit line and another bit line, wherein the first transistor is enabled and the second transistor is disabled during the first phase of the pre-charge of the at least one bit line.

9. The apparatus of claim 8, wherein the memory array is part of a system-on-chip (SOC).

10. A method, comprising:
receiving by a pre-charge circuit, a first input signal to enable a bit line to charge to a first voltage in a first phase;
enabling a first transistor coupled to the bit line during the first phase;
disabling a second transistor cross-coupled with the first transistor to the bit line during the first phase; and receiving by the pre-charge circuit, a second input signal to enable the bit line to charge from the first voltage to a second voltage in a second phase.

11. The method of claim 10, wherein in response to the receiving the first input signal, the method further comprises enabling a transistor coupled between a first voltage supply rail and the bit line.

12. The method of claim 10, wherein in response to the receiving the first input signal, the method further comprises enabling a transistor coupled between a system-on-chip (SOC) voltage supply rail and the bit line.

13. The method of claim 10, wherein in response to receiving the second input signal, the method further comprises enabling a transistor coupled between an SRAM supply rail and the bit line.

14. A system, comprising:
 a main memory having computer-executable instructions stored thereon;
 a processor coupled to the main memory and configured to execute the stored computer-executable instructions to cause generation of at least one input signal;
 at least one cache memory coupled to the processor; the cache memory including a memory array of static random access memory (SRAM) cells, wherein each of the SRAM cells are coupled to a corresponding pre-charge circuit;
 wherein the corresponding pre-charge circuit includes:
 a first and a second voltage supply rail; and
 a first transistor and a second transistor cross-coupled between a bit line and another bit line,
 wherein in response to the at least one input signal, the first voltage supply rail is configured to begin a pre-charge of the bit line in an SRAM cell by supplying a first voltage amount to the bit line, and the second voltage supply rail is configured to continue the pre-charge by supplying a second remaining voltage amount to the bit line,
 and wherein the first transistor is enabled and the second transistor is disabled during the pre-charge based on the first voltage supply rail.

15. The system of claim 14, wherein the first voltage supply rail has a lower voltage than the second voltage supply rail.

16. The system of claim 14, wherein the bit line is coupled to a selected column of the SRAM cells and is configured to be pre-charged after an access operation that includes a read or a write operation.

17. The system of claim 14, wherein the second voltage supply rail is configured to finish the pre-charge after a next access to the memory array is requested.

18. The apparatus of claim 1, wherein the first voltage supply rail is a lower voltage System-on-Chip (SOC) supply rail, and the second voltage supply rail is a higher voltage SRAM supply rail.

19. The apparatus of claim 1, wherein the first bit line remains at a resulting voltage level after the first phase until receiving a request for an access.

20. The apparatus of claim 19, wherein the resulting voltage level is no greater than 0.75 volts.

* * * * *